United States Patent [19]
Watkins

[11] Patent Number: 5,666,289
[45] Date of Patent: Sep. 9, 1997

[54] FLEXIBLE DESIGN SYSTEM

[75] Inventor: Daniel R. Watkins, Los Altos, Calif.

[73] Assignee: LSI Logic Corporation, Milpitas, Calif.

[21] Appl. No.: 980,492

[22] Filed: Nov. 23, 1992

Related U.S. Application Data

[63] Continuation-in-part of Ser. No. 957,672, Oct. 7, 1992, abandoned.

[51] Int. Cl.⁶ .................................................. G06F 17/50
[52] U.S. Cl. .................................... 364/491; 364/489
[58] Field of Search .................................. 364/489, 490, 364/491

[56] References Cited

U.S. PATENT DOCUMENTS

4,630,219  12/1986  DiGiacomo et al. .................. 364/489
4,636,965  1/1987  Smith et al. ........................... 364/491
4,918,614  4/1990  Modarres et al. ..................... 364/490
5,309,371  5/1994  Shikata et al. ........................ 364/491
5,532,934  7/1996  Rostoker ............................... 364/488
5,544,067  8/1996  Rostoker et al. ..................... 364/489

*Primary Examiner*—Kevin J. Teska
*Assistant Examiner*—Thai Phan
*Attorney, Agent, or Firm*—Katz & Cotton, LLP

[57] ABSTRACT

A system for designing an integrated circuit with multiple functions is disclosed. The system creates a set of files defining a structure for a plurality of functions existing within one integrated circuit. Floorplanning modifications are then permissible within any functional block, as well as from one functional block to another since the files for each integrated circuit chip are reconfigureable upon modification. The subject invention also provides for floorplanning modifications involving multiple integrated circuit chips wherein any one functional block may be moved from one integrated circuit chip to another to achieve better optimization with less restrictions.

16 Claims, 6 Drawing Sheets

FLEXIBLE DESIGN SYSTEM

CROSS-REFERENCE TO RELATED APPLICATIONS

This application is a continuation-in-part of U.S. patent application Ser. No. 07/957,672, filed Oct. 7, 1992, now abandoned, entitled FLEXIBLE INTEGRATED CIRCUIT DESIGN, the disclosure of which is incorporated herein by reference.

FIELD OF THE INVENTION

This invention generally relates to the placement of interconnected functional devices within integrated circuit chips, and more particularly, to combining such functional devices into an integrated circuit.

BACKGROUND OF THE INVENTION

Floorplanning, also called chip planning, is the process of determining the most efficient arrangement of functional devices upon an integrated circuit chip. The goals of floorplanning are to: obtain a reliable estimation of an integrated circuit chip's routability; obtain accurate delay estimations prior to layout; analyze and control the delays of networks; analyze and control the skew of networks; facilitate layout; and, improve system-level performance. The end result is a floorplan which is a physical layout showing placement relationships between major top level logic blocks.

The objective of floorplanning is to organize all logic within well defined, easily identifiable, and understandable elements of the hierarchy. A hierarchy contains an all-inclusive top-level function composed of one or more lower-level functions.

A "function" consists of a logic or memory element. A function may be an element or a combination of a number of elements. A function or functional block is a module (or part) in a design's hierarchy that contains connected components. More specifically, functions or functional blocks contain connected components such as megacells, macrocells, macro-functions, lower-level blocks, and their inputs and outputs. A function may be as simple as an inverter or a flip-flop, consisting of one or only a few transistors, or as complex as a shift register, an ALU or even an entire microprocessor, consisting of hundreds of thousands of transistors.

From a mathematical point of view, both formulating and solving the floorplanning problem are quite difficult. A precise mathematical solution essentially cannot be obtained. Heuristic algorithms are therefore employed to approximate the optimum solution to the floorplanning problem.

Moreover, due to the increasing complexity of chip designs, necessitating more and more logic and/or memory elements per unit area, the complexity of the floorplanning problem has increased dramatically. It is, therefore, extremely advantageous to automate this process in some fashion.

Prior to the floorplanning process itself, which involves the placement of functional blocks on a integrated circuit chip, the integrated circuit chip's logic must be designed. Logic designers generally employ hierarchical design techniques to determine the appropriate selection and interconnection of logic and/or memory functions which will enable the integrated circuit chip to perform the desired function. These techniques involve describing the integrated circuit chip's functionality at various "levels of abstraction," ranging from the most general function performed by the integrated circuit chip to the precise functions performed by each logic and/or memory element on the integrated circuit chip.

Thus, a logic designer's hierarchy consists of N levels of functions, where N is an integer ($N \geq 1$) representing the number of hierarchical levels of functionality in the integrated circuit chip, the first level being the integrated circuit chip itself, and where $\underline{n}$ is an integer ($1 \leq n \leq N$) representing the level of any particular function in the hierarchy.

A "parent" function is the $(n)^{th}$ level of the hierarchy is defined as a plurality of $(n+1)^{st}$ level "children" functions, each of which is a "child" function. For example, a microprocessor at the $(n)^{th}$ level might be defined as the parent of the following $(n+1)^{st}$ level children: an ALU, a series of registers, a bus and various other functions (each of which may or many not have a plurality of $(n+2)^{nd}$ level children, and so on).

Note that lower levels of the hierarchy are commonly denoted by successively higher numbers. Thus, while level 1 refers to the top (integrated circuit chip) level of the hierarchy, levels 2, 3 and 4 constitute successively "lower" levels of the hierarchy.

Each child function which is not also a parent function (i.e., which has no children) is referred to as a "terminal" (or "leaf") function. Accordingly, a terminal function is a function at the lowest level of the design's hierarchy since it does not contain any lower-level blocks. Each terminal function is connected to at least one other terminal function, such connection being commonly referred to as a "net." A series of nets, each of which defines a plurality of interconnected functions, is commonly referred to as a "net list."

Major concerns of a logic design include routability and feasibility. Feasibility is a percent representing the probability of layout of a particular design in a specified integrated circuit chip area. Routability is a measure of how easy it will be to interconnect all of the elements in a given design.

Feasibility is calculated by first randomly placing the functions in the specified integrated circuit chip area, and then determining how much routing space is actually required. The feasibility percent equals the availability space for routing (specified integrated circuit chip area less the sum of the areas of all functions) divided by the routing space actually required. This percent is, of course, limited to 100%. The placement of functions can be undertaken using random, pseudo-random, and heuristic approaches.

Previous floorplanning techniques determined routability by hierarchical estimation of the unknown function area as well as the optimization of hierarchical interconnections of functions. Estimating the mount of routing space requires a means of estimating a function's area that it encompasses. Estimation is necessary at the initial stages of floorplanning since the precise area of a function may be unknown because certain functions have not been laid out.

Former inventions, such as U.S. Pat. No. 4,918,614, attempted to solve this problem by estimating the area of terminal functions whose elements have not been laid out and their respective parent functions. Requisite routing space can also be estimated by algorithms such as one that takes into account the shape or size and relative location of a particular module to the other modules, required interconnections to Input/Output ("I/O") pads, and heuristically estimating the connections routing and end-points, among other methods.

Current floorplanning methods use design information from the logic systems and from a bonding diagram program to place functional blocks on a integrated circuit chip automatically. Block placement allows for accurate delay estimation calculations. Once the blocks are placed, analysis of the connections between blocks, and changes in block sizes, shapes, positions, or connections to improve the pre-layout estimated delays of user-defined critical nets can take place.

Current floorplanning processes also provide the user with both graphic and alphanumeric information. Blocks are displayed in the sizes and shapes that they occupy in the integrated circuit chip. Lines of various widths represent relative numbers of connections between blocks. The width of the line connecting two blocks reflects the number of wires connecting cells between them, relative to the number of wires connecting cells between other blocks.

Previous floorplanning techniques roughly fall into two basic categories: (1) "flat" floorplanners, which attempt to minimize space at only one level (the "level" which is created when the hierarchy is flattened by omitting all but the terminal functions, by placing all but the terminal functions), by placing only terminal functions; and (2) "top-automated" floorplanners, which automate the floorplanning process at only the top level, by placing only two dimensional (2D) level functions.

Significant disadvantages of former methods of floorplanning include: requiring that connection computations be done first, which may not be necessary when a particular location candidate set is being analyzed; providing insufficient efficiency when considering multiple integrated circuit chips; and, no means of optimizing across multiple integrated circuit chips.

Prior floorplanning techniques have been limited to concentrating upon one integrated circuit chip of an integrated circuit. This entailed inputting information about the structure of the integrated circuit chip being analyzed as well as information about the connections which one integrated circuit chip would have with respect to all other integrated circuit chips. Subsequent logic changes would then require that simulation sequences be undertaken to obtain results. However, no modifications could be made to any other integrated circuit chip. Modifications to any other integrated circuit chip would require the user to enter updated structure and connection information of the second integrated circuit chip and then determine results.

This tedious process of updating and analyzing each integrated circuit chip individually was necessary until a satisfactory design was achieved. Thus, the efficiency of prior floorplanning techniques for integrated circuits with multiple integrated circuit chips was laborious, time consuming and inefficient.

Prior floorplanning techniques became most inefficient when a recombination of functional blocks was sought between two integrated circuit chips. For example, in a given integrated circuit chip set, a particular circuit could conceivably be located on any one of the integrated circuit chips. However, each integrated circuit chip had to be laid out separately. The available floorplanning techniques did not allow for the simultaneous optimization of multiple integrated circuit chips to determine the best location for such a circuit. When one functional block was desired to be moved from one integrated circuit and added to a second integrated circuit, it required that the first integrated circuit chip and the second integrated circuit chip be separately reanalyzed after the entering of revised inputs and a revised circuit configuration for each of the integrated circuit chips.

Although prior efforts may have provided a hierarchical floorplanning system that approximated a globally optimum solution to the floorplanning problem with regard to a particular integrated circuit, no prior an system has been able to provide a floorplanning system that is able to analyze and adjust a logic design which requires movement of functional blocks between integrated circuit chips. Therefore, prior floorplanning techniques were unable to achieve optimization across multiple integrated circuit chips.

SUMMARY OF THE INVENTION

The present invention overcomes the aforementioned deficiencies of the prior an by providing a method and apparatus for designing an integrated circuit with multiple functions. The floorplanning method entails creating a number of files that are capable of comprehending the structure of a plurality of functions existing within one integrated circuit. Floorplanning modifications are then permissible within any one functional block, as well as from one functional block to another since the files for each integrated circuit chip are reconfigured upon modification. The subject invention also provides for floorplanning modifications involving multiple integrated circuit chips wherein any one functional block may be moved from one integrated circuit chip to another to achieve better optimization with less restrictions.

DETAILED DESCRIPTION OF THE INVENTION

COMPUTER SYSTEM

Figure 1:
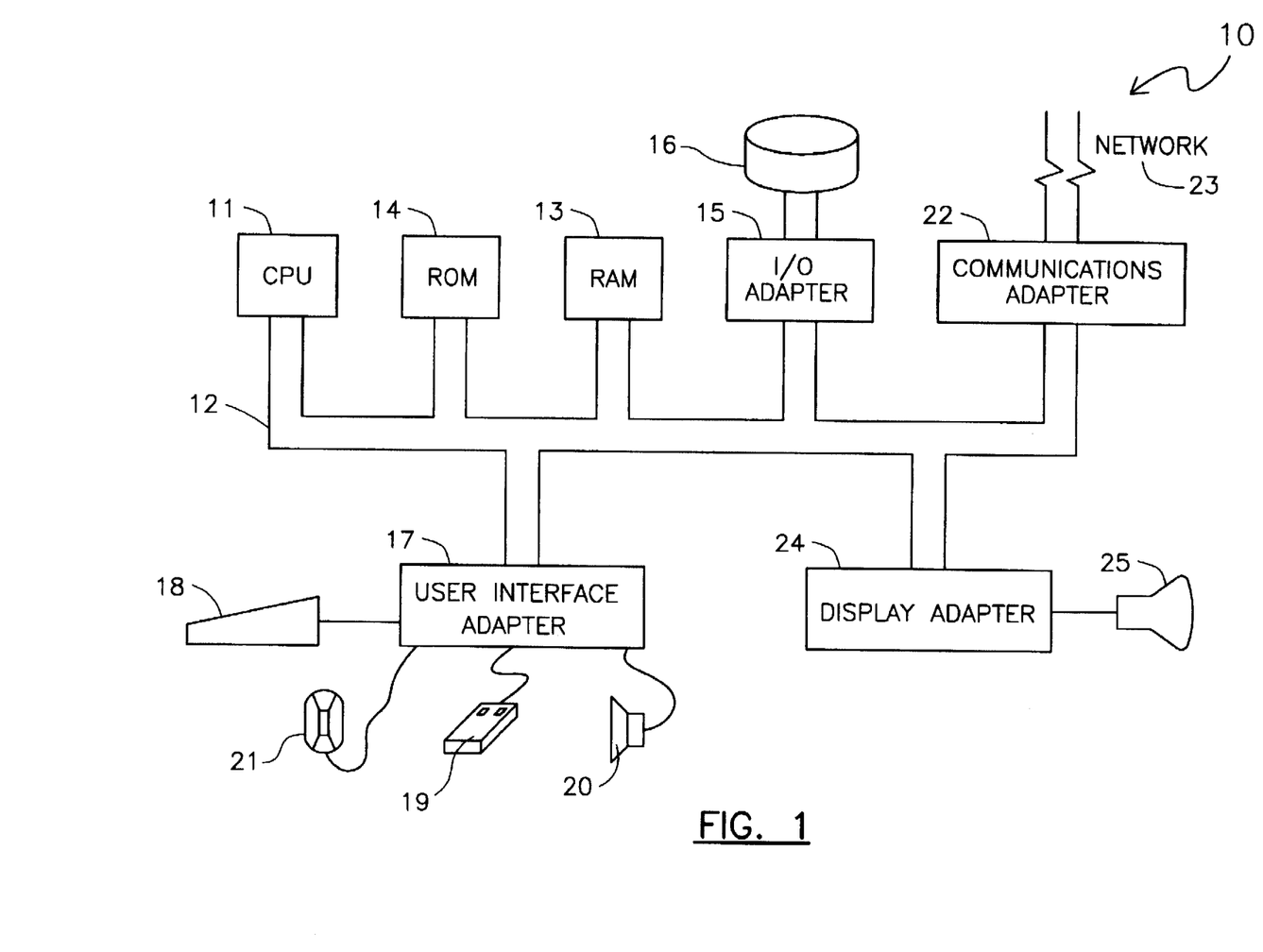
FIG. 1 is a block diagram of a computer system in accordance with the subject invention.

A representative hardware environment is depicted in FIG. 1, which illustrates a suitable hardware configuration of a workstation 10 in accordance with the present invention. The workstation 10 has a central processing unit 11, such as a conventional microprocessor, and a number of other units interconnected via a system bus 12. The illustrated workstation 10 shown in FIG. 1 includes a Random Access Memory (RAM) 13, a Read Only Memory (ROM) 14, an I/O adapter 15 for connecting peripheral devices such as disk units 16 to the bus 12, a user interface adapter 17 for connecting a keyboard 18, a mouse 19, a speaker 20, a microphone 21, and/or other user interface devices such as a touch screen device (not shown) to the bus 12. The workstation may also have a communications adapter 22 for connecting the workstation 10 to a data processing network 23 and a display adapter 24 for connecting the bus 12 to a display device 25.

A preferred logic design program embodying the present invention may be supported on a computer workstation 10 with 24 megabytes of real memory and seventy-two megabytes of virtual memory. The workstation 10 employs the display device 25, keyboard 18, and mouse 19 to permit a user to interact with the various programs. A graphical editor is preferably utilized to draw schematics of each module or component that is desired.

A workstation 10 which has given satisfactory results in practice has resident thereon the SUN SPARC desktop software which is a UNIX derivative as described in SUN's SPARCstation 1+ Installation Guide (1990), which is incorporated herein by reference. The LSI Modular Design Environment is also resident on the workstation and described in detail in the Network Design Language (NDL) reference published by LSI Logic Corporation (1987), which is incorporated herein by reference. Also resident on the workstation is the Planner and Chip Evaluator Program (LPACE) Chip Planning System which is described in the Chip Planning System User's Guide which is published by LSI Logic Corporation (1987), and which is incorporated herein by reference.

INPUTS

Figure 2:
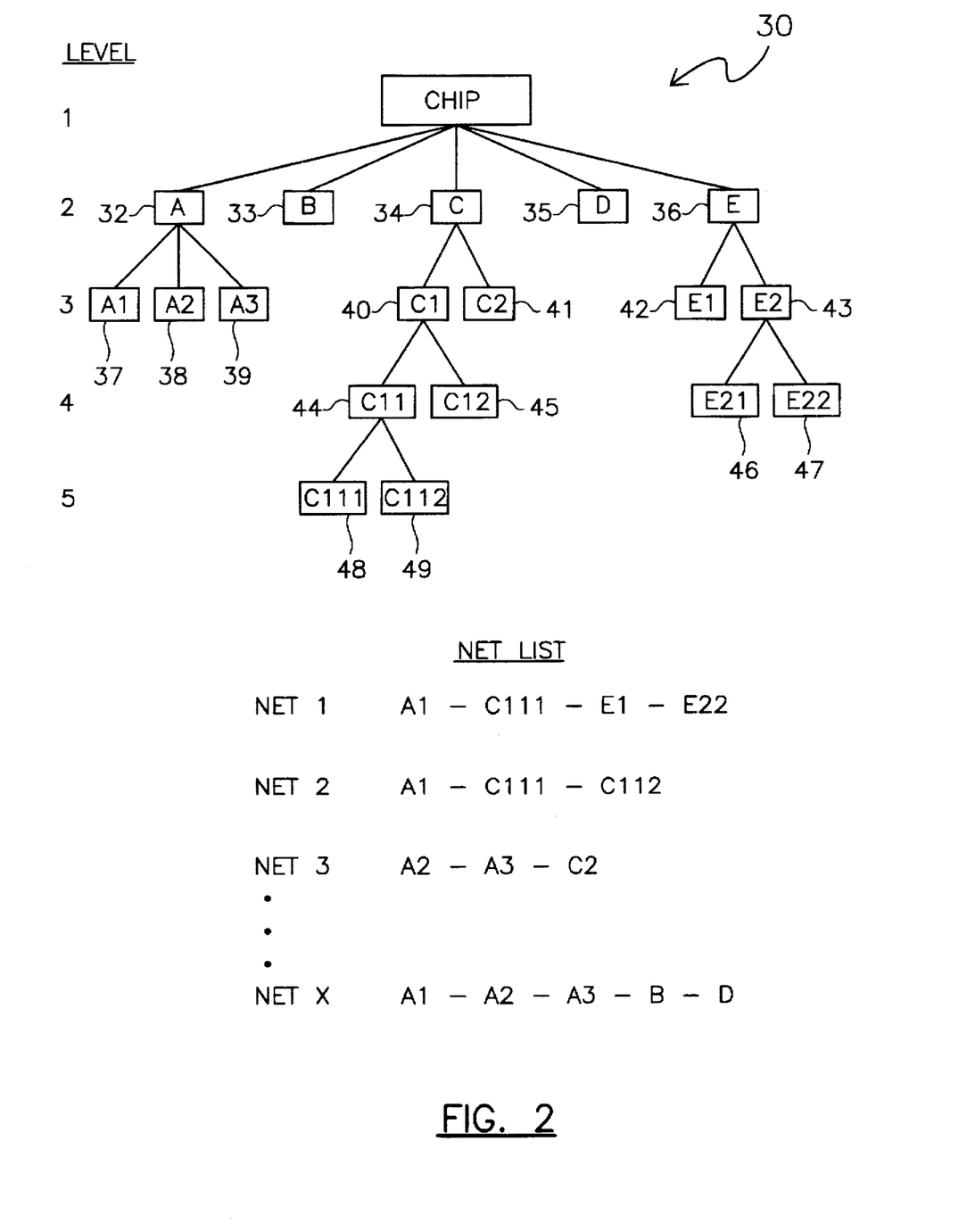
FIG. 2 illustrates an example of a hierarchy of functions specified by the logic designer, as well as a net list of interconnections among the terminal functions of that hierarchy.

FIG. 2 illustrates an example of a logical hierarchy of functions 30 which this system might be asked to process. The CHIP 31 itself constitutes Level 1 of the hierarchy. The CHIP 31 has children, A, B, C, D and E, referred to with reference numerals 32, 33, 34, 35, and 36, respectively. Such children constitute Level 2 of the hierarchy. Level 3 contains: A1, A2 and A3, referred to with reference numerals 37, 38, and 39, respectively, which are the children of A 32; C1 and C2, referred to with reference numerals 40 and 41, respectively, which are the children of C 34; and, E1 and E2, referred to with reference numerals 42 and 43, respectively, which are the children of E 36. Level 4 contains: C11 and C12, referred to with reference numerals 44 and 45, respectively, which are the children of C1 40; and, E21 and E22, referred to with reference numerals 47 and 48, respectively, which are the children of E2 43. Finally, Level 5 contains C111 and C112, referred to with reference numerals 48 and 49, respectively, which are the children of C11.

Note that terminal functions exist not merely at the bottom of the hierarchy Level 5 (C111 48 and C112 49), but also at Level 2 (B 33 and D 35), Level 3 (A1 37, A2 38, A3 39, C2 41 and E1 42) and Level 4 (C12 45, E21 46 and E22 47). The NET LIST indicates the interconnections among such terminal functions. For example, Net 1 indicates that functions A1 37, C111 48, E1 42 and E22 47 are interconnected, although it does not specify which pairs of such functions will actually be connected directly. As described in greater detail below, however, the system embodying this invention estimates the expected number of connections between such functions, or functional blocks.

Macrocell, macro function and megafunction components are accessible by entering the appropriate code. For instance, ":GET .MACROFCN_NAME." is entered to retrieve a macro function with the desired name. The graphical editor employs drawing notations such as input, output, bi-directional, buses, bundles and extractor as a means of connecting functions.

Commands can then be entered into the graphical editor to create a hierarchical level out of a selected group of objects or to remove a level of hierarchy from the design. Moreover, commands may be used to rearrange components to make the schematic more readable.

Each hierarchical level has a symbol level and a corresponding network level. The top network level, which is essentially the library menu, is viewed by the user. The user may define a function at the very top level and then place it at any level within the hierarchy. Alternatively, the user may define the function at the level of the hierarchy where it will be ultimately placed.

Once a desired design has been achieved, a network list file (".NETLIST") of the design may be created. A design symbol and network may also be saved in a file called "<design>.def." However, in the event that an error is detected, the error must be corrected or explained. Once the desired design has been achieved a number of subsequent programs are employed.

SYSTEM ARCHITECTURE

Figure 3:
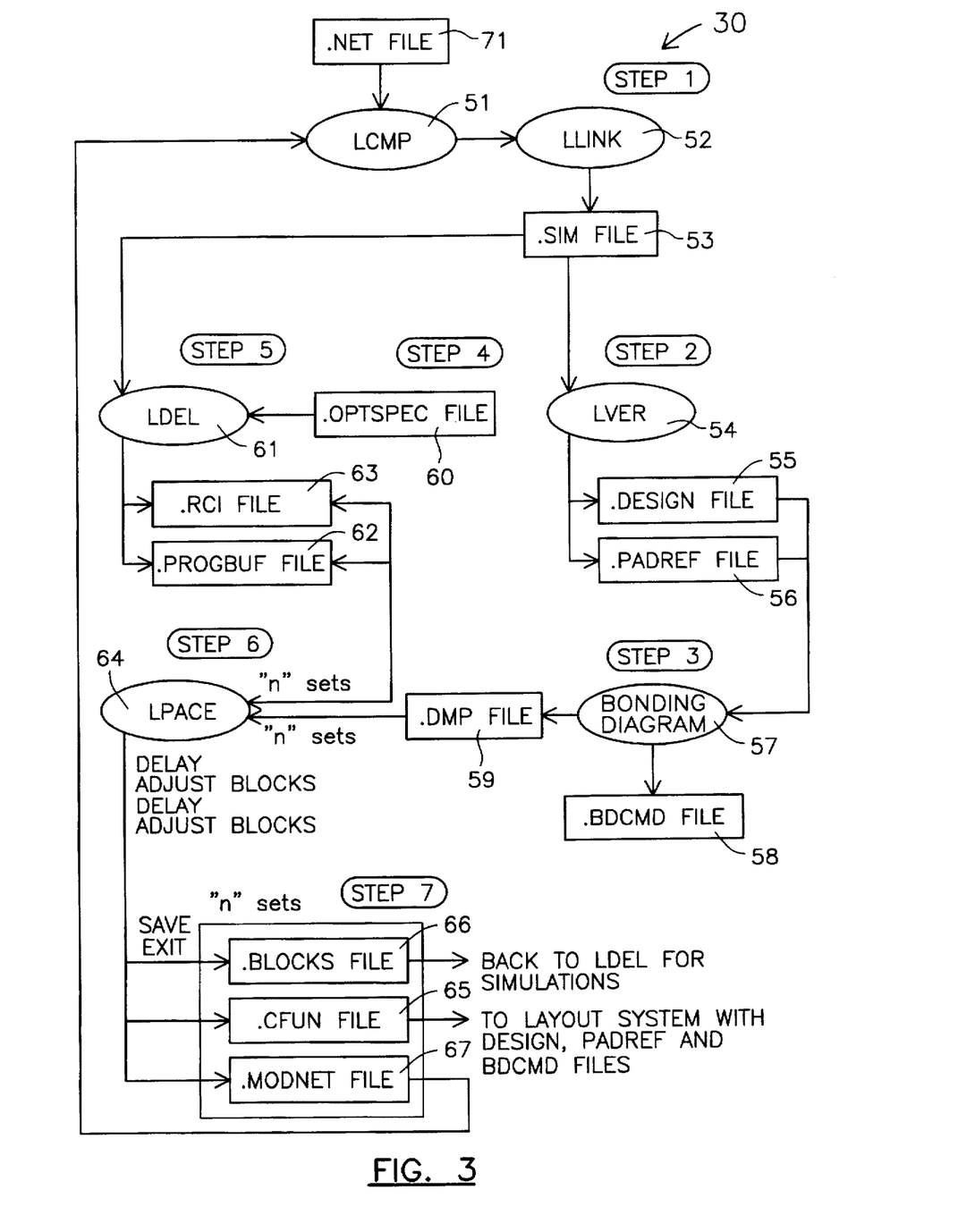
FIG. 3 illustrates the basic system architecture of the preferred embodiment of this invention.

Referring to FIG. 3, a software flowchart of the logic system invention 50 is generally identified. After, an integrated circuit is described, the description is compiled through the LCMP 51 program. Thereafter, the compiled program is linked through the LLINK 52 program to yield the .SIM 53 file (a simulation file). The .SIM 53 file is then utilized as the input to the LVER 54 program (logic system verification program) to yield .DESIGN 55 and .PADREF 56 files. Thereafter, the .DESIGN 55 and .PADREF 56 files are employed as input to the Bonding Diagram program 57.

The Bonding Diagram program 57 goes on to further create .BDCMD 58, a bonding diagram command file, as well as further edit the contents of the .BDCMD 58 file to establish the design's pin-to-pad connections. Using the edited .BDCMD 58 file as input, the Bonding Diagram program 57 is run again. Once the Bonding Diagram program 57 runs without any errors, a dump file termed .DMP 59 is created for each of the (n) integrated circuit chips within the design.

Subsequently, a logic system .OPTSPEC 60 file is created which contains statements defining the maximum allowable delays and the maximum skew constraint for critical nets. The .OPTSPEC 60 file is then employed as input to the LDEL 61 program (logic system delay program). Using the RCI option, the LDEL 61 program is then run to create a .PROGBUF 62 and .RCI 63 file for each of the (n) integrated circuit chips within the design.

Thereafter, the (n) .DMP 59 files, the (n) .RCI 63 files, and the (n) .PROGBUF 62 files are utilized as input to the LPACE 64 program to place the functional blocks of each integrated circuit. The LPACE 64 program is used to adjust the floorplan and recalculate delays until satisfied with the estimated delays. When satisfied with estimated delays, "SAVE" and "EXIT" the LPACE 64 program to generate (n) .CFUN 65 files, (n) .BLOCKS 66 files, and (n) .MODNET 67 files.

Each of the files generated by the LPACE 64 are then inputted back to earlier used programs in order to update delays of any adjusted floorplan. Specifically, the (n) .CFUN 65 files are used as input to the layout system, where, in turn, the layout system is used to input the LDEL 61 program, the (n) .BLOCKS 66 files are also inputted to the LDEL 61, whereas the (n) .CFUN 65 files are inputted into the LCMP 51 program. Finally, LDEL 61 program is rerun to update delay information for the adjusted floorplan.

Figure 4:
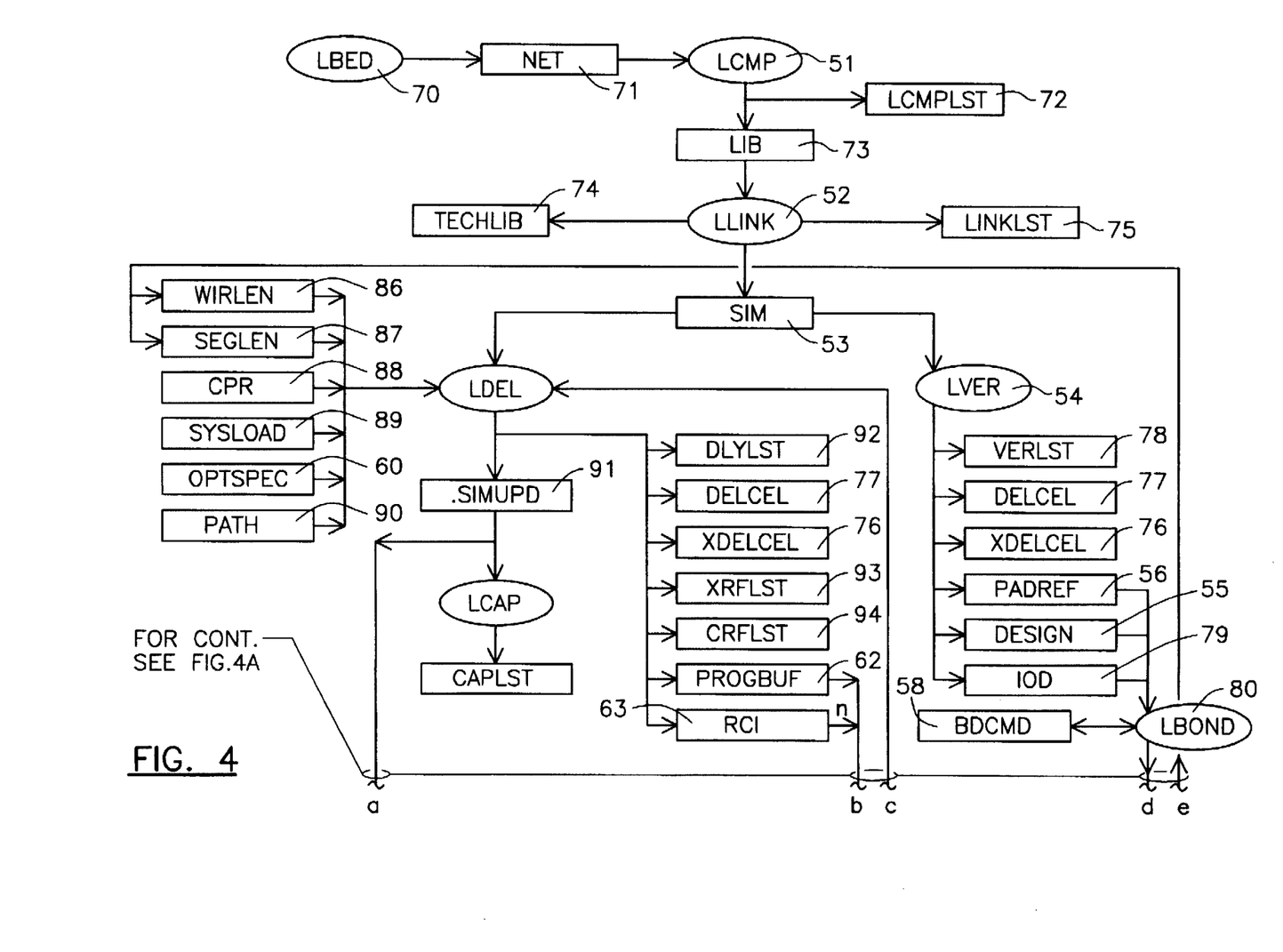
FIGS. 4, 4A and 4B illustrate the detailed system architecture of the preferred embodiment of the invention.
Figure 4A:
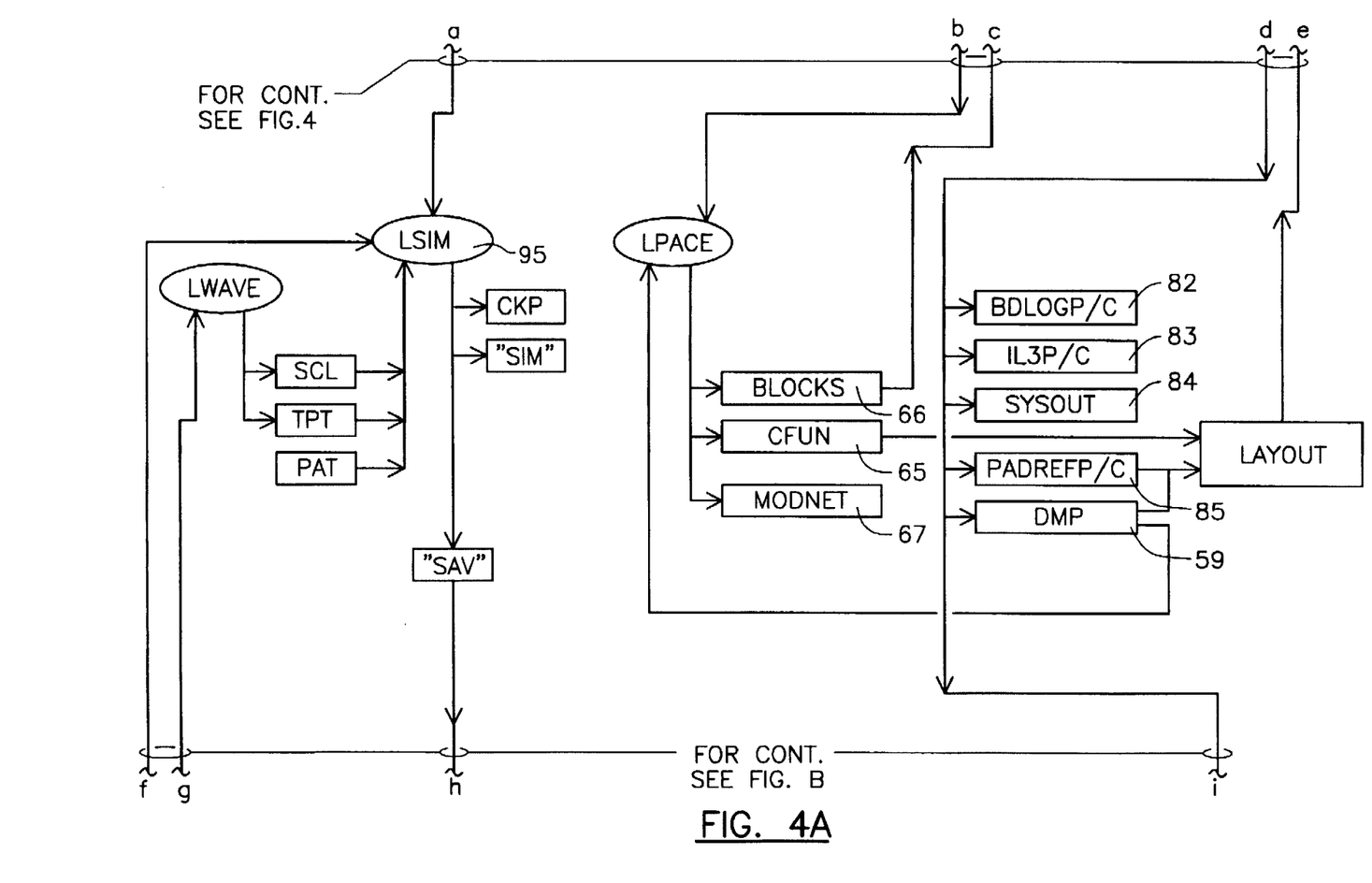
Figure 4B:
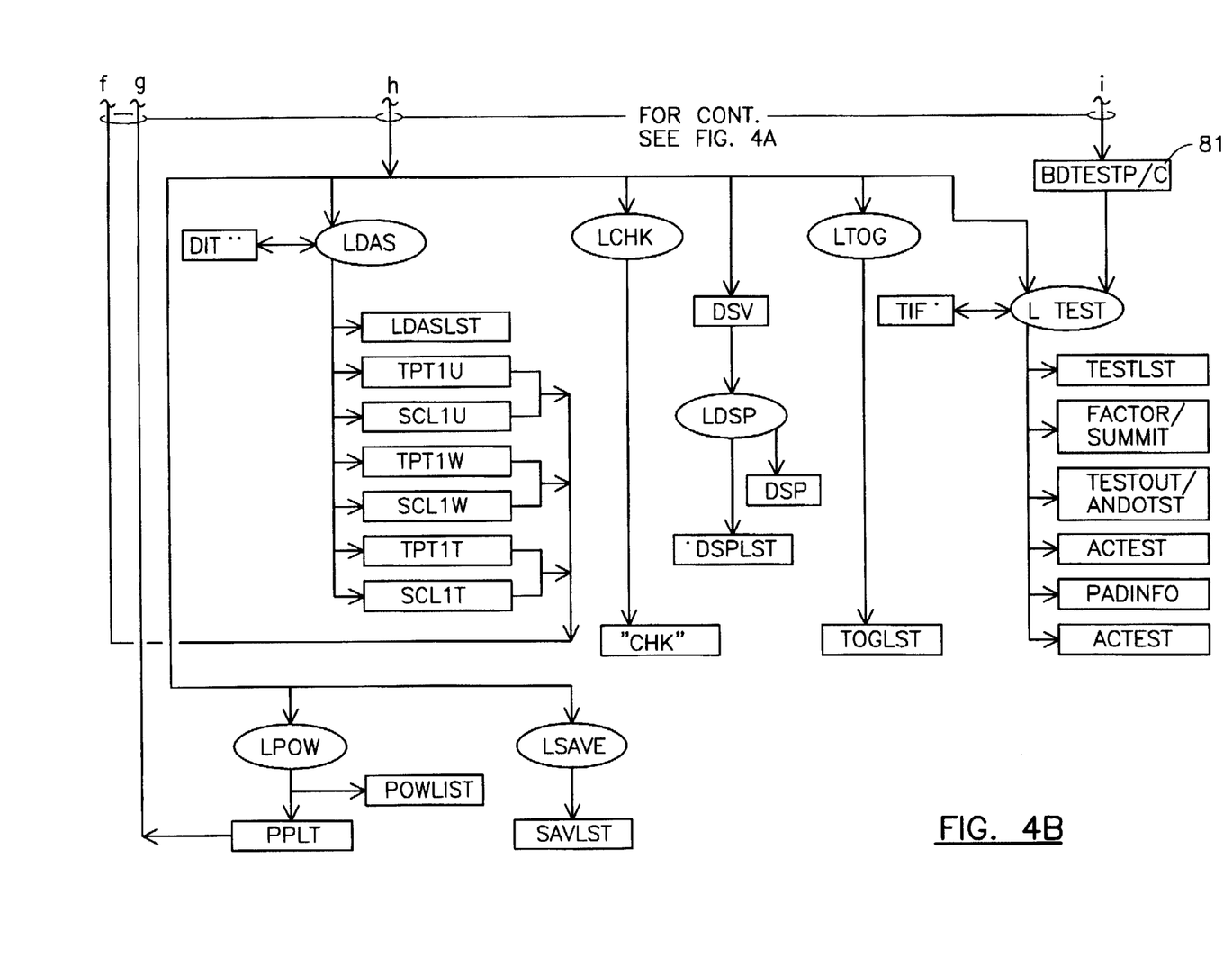

Referring to FIGS. 4, 4A and 4B a detailed software flowchart of the logic system invention 50 is illustrated in six different phases. In the first phase the LSED 70 program is employed to yield the .NET 71 file which is the user-created network description file. The .NET 71 file is then inputted into LCMP 51, a program that compiles network description files. The LCMP 51 program outputs both the .LCMPLIST 72 file and the .LIB 73 file. The .LCMPLIST 72 file is a diagnostic output file of LCMP 51 whereas the .LIB 73 file is a library file which contains the compiled version of the network. Thereafter, the .LIB 73 file is inputted into the LLINK 52 program along with the .TECHLIB 74 file which is formed from libraries of models for the chosen technology. The LLINK 52 program links the compiled .LIB 73 file with the .TECHLIB 74 file to yield the .LINKLST 75 file and the .SIM 53 file. The .SIM 53 file is then used to determine both delay prediction and design verification.

In the second phase, the LVER 54 program performs electrical rule checking on the design and outputs six files from the input of the .SIM 53 file. The LVER 54 program verifies a network by checking: the number of gates used against the number of gates available; the number of pads used for power, ground and I/O against the number of available pads; cell-to-cell electrical connections for wiring feasibility; to ensure that high-level logic functions are used in valid hierarchical configurations; and, to ensure that high-level functions will fit on a selected die. The six output files of the LVER 54 program are .DESIGN 55, .PADREF 56, .XDELCEL 76, .DELCEL 77, .VERLST 78, and .IOD 79. The .DESIGN 55 file contains the network interconnects for layout. The .PADREF 56 and .IOD 79 files contain input/output data from logic simulation and input/output parametric data. The .VERLST 78 file contains network summary statistics. In conjunction with LDEL 61 program, the .DELCEL 77 and .XDELCEL 76 files are formed.

In the third phase, the LBOND 80 program is utilized to define input/output connections between the package and the die (i.e., specify network pinout) and check for violations of mechanical and electrical packaging rules. The .PADREF 56, .DESIGN 55 and .IOD 79 files are inputted into the LBOND 80 program along with the .BDCMD 58 file. The .BDCMD 58 file is a user created file containing package pin-to-pad assignments. Six files are then generated by the LBOND 80 program: .BDTESTP/C 81, .BDLOGP/C 82, .IL3P/C 83, .SYSOUT 84, .PADREFP/C 85 and .DMP 89.

The .BDTESTP/C 81 file is used in assembly whereas the .BDLOGP/C 82 file is used for troubleshooting results from the LBOND 80 program. The .IL3P/C 83 file is a plotting output file. The .PADREFP/C 85 file contains I/O pad information. A .DMP 59 file is generated for each of the (n) integrated circuit chips within the design. One of the purposes of the multiple .DMP 59 files is to preserve the region information should LBOND 80 terminate unexpectedly. The .PADREFP/C 85 and multiple .DMP 59 files are then combined to form the bonding diagram and inputted into the .WIRLEN 86 and .SEGLEN 87 files (of the LDEL 61 program which is run subsequently).

In the fourth phase, the LDEL 61 program generates the delay file for the simulation program. Four external files, the .SIM 53 file, the .BLOCKS 66 output file, the .WIRLEN 86 file, and the .SEGLEN 87 file are inputted into the LDEL 61 program. The four external files which are generated are termed .CPR 88, .SYSLOAD 89, .OPTSPEC 60, and .PATH 90.

The .SYSLOAD 89 file specifies the output buffer loading information. The .OPTSPEC 60 file specifies optimization information for use in layout including critical net, programmable output buffers, clock net and bus lines, maximum skew time, and maximum margin. The .PATH 90 file allows the user to specify the critical path of the network. The .WIRLEN 86 file is a layout file containing exact metal wirelengths. Finally, the .SEGLEN 87 file is a layout file containing exact segment lengths of wires after layout.

The LDEL 61 program outputs an updated simulation file, .SIMUPD 91, containing delay information as well as .DLYLST 92, .DELCEL 77, .XDELCEL 76, .XRFLST 93 and .CFRLST 94 files. The .DLYLST 92 file lists the user-specified payload information and default loading. The .DELCEL 77 and XDELCEL 76 files contain a list of all cells that were deleted since they were found to be unnecessary by the LDEL program. The .XRFLST 93 and .CRFLST 94 files are default outputs of the LDEL 61 program which cross-reference nets and cells.

Furthermore, the LDEL 61 program generates both a .RCI 63 and .PROGBUF 62 file for each of the (n) integrated circuit chips within the design. Each .RC1 63 file contains critical signal or delay information to be used as inputs to the LPACE 64 program or layout. On the other hand, each .PROGBUF 62 file is employed as an output file for programmable buffers.

In the sixth phase, LPACE 64 program performs hierarchical floorplanning and prepares wirelength information to allow a more accurate pre-layout delay prediction. The multiple .PROGBUF 62, .RC1 63 and .DMP 59 files (one file for each of the (n) integrated circuit chips) are the inputs to the LPACE 64 program. Once the LPACE 64 program has ran, any modifications to the floorplan can be made to any one integrated circuit chip or between any integrated circuit chips of the floorplan.

Commands within the LPACE 64 program allow for a design of integrated circuit chips to be reconfigured by changing of block shapes, changing of block sizes, moving block positions, grouping of blocks together, display of interconnect density, display of delay violations and display of the relative sizes of blocks. The LPACE 64 program, by itself, is capable of adjusting the floorplan and providing estimated delays. However, for exact delays to be determined, the LDEL 61 program must be regenerated.

Any minor logic changes made after running the LPACE 64, can be in evaluated through an interim design by running an abbreviated simulation sequence involving the LCMP 51, LLINK 52, LDEL 61, and LSIM 95 programs. The final design must, however, be evaluated more thoroughly by rerunning the LVER 54 program (to update the .DESIGN 55 and .PADREF 56 files) and the Bonding Diagram program 57 prior to obtaining sign-off on the final design.

To determine exact delays, sets of (n) .BLOCKS 66, .CFUN 65 and .NETMOD files (each corresponding to a particular integrated circuit chip) are then generated by the LPACE 64 program. Each .BLOCKS 66 file is then inputted into the LDEL 61 program for simulations. Each .CFUN 65 file is then inputted into the Layout System (with .DESIGN 55 and .PADREF 56 files from the LBOND 80 program). Each .NETMOD file, which are modified net files, is then inputted into the LCMP 51 program. The entire process is then redone to yield the final design.

While the invention has been described in terms of a preferred embodiment in a specific system environment, those skilled in the art recognize that the invention can be practiced, with modification, in other and different hardware and software environments within the spirit and scope of the appended claims.

Having thus described our invention, what we claim as new, and desire to secure by Letters Patent is:

1. A method for designing the layout of a plurality of functional blocks on an integrated circuit, comprising the steps of:
   (a) designing at least one integrated circuit containing at least two semiconductor dice, each of the dice containing a plurality of functional blocks;
   (b) establishing available space for each of the plurality of functional blocks on the dice;
   (c) optimizing the allocation of available space for the plurality of functional blocks on the dice;
   (d) determining a routability percentage for the plurality of functional blocks;

(e) determining a feasibility percentage for the plurality of functional blocks; and (f) terminating the design of the at least two dice if the routability percentage and the feasibility percentage are acceptable, if not acceptable, repeating steps (b) through (f).

2. The method for designing an integrated circuit as recited in claim 1, including the steps of:

(a) changing the location of at least one of the plurality of functional blocks from one of the at least two dice to another of the at least two dice;

(b) redetermining a routability percentage for the at least one of the plurality of functional blocks;

(c) redetermining a feasibility percentage for the at least one of the plurality of functional blocks;

(d) refabricating the at least two dice if the routability percentages and the feasibility percentages are acceptable.

3. The method for designing an integrated circuit as recited in claim 1, including the steps of:

(a) changing a block target utilization for at least one of the plurality of functional blocks;

(b) establishing available space for each of the plurality of functional blocks, and an area thereof;

(c) determining a routability percentage for each of the plurality of functional blocks;

(d) determining a feasibility percentage for each of the plurality of functional blocks; and (e) fabricating the at least two dice if the routability percentages and feasibility percentages are acceptable.

4. The method for designing an integrated circuit as recited in claim 1, including the steps of:

(a) changing a form for at least one of the plurality of functional blocks;

(b) establishing available space for each of the plurality of functional blocks, and an area thereof;

(c) determining a routability percentage for each of the plurality of functional blocks;

(d) determining a feasibility percentage for each of the plurality of functional blocks; and (e) fabricating the at least two dice if the routability percentages and feasibility percentages are acceptable.

5. The method for designing an integrated circuit as recited in claim 1, including the steps of:

(a) changing a fixed input/output for at least one the plurality of functional blocks;

(b) establishing available space for each of the plurality of functional blocks, and an area thereof;

(c) determining a routability percentage for each of the plurality of functional blocks;

(d) determining a feasibility percentage for each of the plurality of functional blocks; and (e) terminating the design of the at least two dice if the routability percentages and feasibility percentages are acceptable, if not acceptable, repeating steps (a) through (e).

6. The method for designing an integrated circuit as recited in claim 1, wherein the step of determining a feasibility percentage employs a random construct.

7. The method for designing an integrated circuit as recited in claim 1, wherein the step of determining a feasibility percentage employs a pseudo-random construct.

8. The method for designing an integrated circuit as recited in claim 1, wherein the step of determining a feasibility percentage employs a heuristic construct.

9. An apparatus for designing an integrated circuit having at least two semiconductor dice, said apparatus comprising:

(a) computer means for designing an integrated circuit comprising at least two semiconductor dice, said at least two dice being comprised of a plurality of functional blocks;

(b) computer means for determining locations for the plurality of functional blocks upon the at least two dice;

(c) computer means for establishing available space for the plurality of functional blocks, a number of connections therebetween, and an area thereof;

(d) computer means for determining a routability percentage and a feasibility percentage for each of the plurality of functional blocks upon the at least two dice;

(e) computer means for redetermining a routability percentage and a feasibility percentage for each of the plurality of functional blocks if one of the plurality of functional blocks is moved from one of the at least two dice to another of the at least two dice; and (f) means for providing design information for the at least two dice if the routability percentages and the feasibility percentages are acceptable.

10. The apparatus as recited in claim 9, including:

(a) computer means for changing the location of at least one of the plurality of functional blocks from one of the at least two dice to another of the at least two dice if the routability percentage or the size of the at least one of the plurality of functional blocks is unacceptable.

(b) computer means for establishing available space for each of the plurality of functional blocks, and an area thereof;

(c) computer means for determining a routability percentage and a feasibility percentage for each of the plurality of functional blocks; and (d) computer means for designing the at least two dice if the routability percentages and the feasibility percentages are acceptable.

11. The apparatus as recited in claim 9, including:

(a) computer means for changing a block target utilization for at least one of the plurality of functional blocks;

(b) computer means for establishing available space for each of the plurality of functional blocks, and an area thereof;

(c) computer means for determining a routability percentage and a feasibility percentage for each of the plurality of functional blocks; and (d) means for designing the at least two dice if the routability percentages and the feasibility percentages are acceptable.

12. The apparatus as recited in claim 9, including:

(a) computer means for changing a form for at least one of the plurality of functional blocks;

(b) computer means for establishing available space for each of the plurality of functional blocks, and an area thereof;

(c) computer means for determining a routability percentage and a feasibility percentage for each of the plurality of functional blocks; and (d) computer means for designing the at least two dice if the routability and feasibility percentages, and the size are acceptable.

13. The apparatus as recited in claim 9, including:

(a) computer means for changing a block fixed input/output for at least one of the plurality of functional blocks;

(b) computer means for establishing available space for each of the plurality of functional blocks, and an area thereof;

(c) computer means for determining a routability percentage and a feasibility percentage for each of the plurality of functional blocks; and (d) computer means for designing the at least two dice if the routability percentages and the feasibility percentages are acceptable.

14. The apparatus as recited in claim 9, including computer means for determining locations on the at least two dice for the plurality of functional blocks by employing a random construct.

15. The apparatus as recited in claim 9, including computer means for determining locations on the at least two dice for the plurality of functional blocks by employing a pseudo-random construct.

16. The apparatus as recited in claim 9, including computer means for determining locations on the at least two dice for the plurality of functional blocks by employing a heuristic construct.

* * * * *